(12) United States Patent
Hente

(10) Patent No.: US 8,319,434 B2
(45) Date of Patent: Nov. 27, 2012

(54) OLED ILLUMINATION DEVICE WITH INTEGRATED PROXIMITY SENSOR

(75) Inventor: Dirk Hente, Wuerselen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 190 days.

(21) Appl. No.: 12/863,994

(22) PCT Filed: Jan. 27, 2009

(86) PCT No.: PCT/IB2009/050319
§ 371 (c)(1),
(2), (4) Date: Jul. 22, 2010

(87) PCT Pub. No.: WO2009/095848
PCT Pub. Date: Aug. 6, 2009

(65) Prior Publication Data
US 2010/0295604 A1   Nov. 25, 2010

(30) Foreign Application Priority Data
Jan. 29, 2008   (EP) ..................... 08101062

(51) Int. Cl.
*H05B 39/00* (2006.01)
(52) U.S. Cl. .......................... 315/94; 315/291
(58) Field of Classification Search .............. 315/94–95, 315/291, 294, 297
See application file for complete search history.

(56) References Cited

U.S. PATENT DOCUMENTS

| | | | |
|---|---|---|---|
| 6,774,882 B2 * | 8/2004 | Yamazaki et al. | 345/98 |
| 6,927,761 B2 | 8/2005 | Badaye et al. | |
| 7,109,966 B2 * | 9/2006 | Abe et al. | 345/100 |
| 7,176,885 B2 | 2/2007 | Troxell et al. | |
| 7,286,118 B2 | 10/2007 | Van Berkel | |
| 2003/0159910 A1 | 8/2003 | Caldwell | |
| 2003/0213624 A1 | 11/2003 | Cross et al. | |
| 2004/0017362 A1 | 1/2004 | Mulligan et al. | |
| 2004/0189612 A1 | 9/2004 | Bottari et al. | |
| 2004/0238726 A1 | 12/2004 | Caldwell | |
| 2004/0263483 A1 | 12/2004 | Aufderheide | |
| 2007/0125937 A1 | 6/2007 | Eliasson et al. | |
| 2007/0152977 A1 | 7/2007 | Ng et al. | |
| 2007/0216657 A1 | 9/2007 | Konicek | |
| 2008/0036746 A1 * | 2/2008 | Klinghult | 345/176 |

FOREIGN PATENT DOCUMENTS

| | | |
|---|---|---|
| EP | 1251455 A2 | 10/2002 |
| EP | 1589407 A1 | 10/2005 |
| GB | 2428804 A | 2/2007 |

OTHER PUBLICATIONS

Lee et al: "Dielectric Phenomena of an Organic Light Emitting Diode"; Molecular Crystals and Liquid Crystals Science and Technology, 2001, vol. 70, pp. 73-76.

* cited by examiner

*Primary Examiner* — James H Cho
(74) *Attorney, Agent, or Firm* — Kenneth Springer; Mark L. Beloborodov

(57) ABSTRACT

The invention concerns an OLED device with a cathode 1, an anode 2 and an active stack 3, wherein the anode 1 is segmented into a plurality of anode segments 8 each defining an OLED segment 4. Further, a capacitance measuring unit 12 is provided which is arranged for measuring a plurality of capacitance coefficients between two anode segments 8 and/or between an anode segment 8 and surrounding earth, respectively. This way, an OLED device for illumination purposes with a reliable proximity sensing function is achieved.

19 Claims, 4 Drawing Sheets

OLED ILLUMINATION DEVICE WITH INTEGRATED PROXIMITY SENSOR

FIELD OF THE INVENTION

The invention relates to the field of OLED devices and near field imaging touch sensors.

BACKGROUND OF THE INVENTION

Touch sensors are applied in different technical fields. They offer the possibility of controlling a device by simply touching a predefined area of a surface like an operation screen. For that, often a change in "common mode" capacitance to ground is used. In contrast to that, near field imaging reacts on local field changes and not to a "common mode" capacitance to ground. Therefore, near field imaging provides a more reliable way of operating a touch sensor compared to standard touch sensors operated in a "common mode" technique. Further, near field imaging allows to detect not only the approach of an external object like a finger but also the object's positions. Thus, for example, near field imaging also allows for controlling a system with the help of a touch screen sensor by pointing onto different screen areas with respective functions with a finger tip. According touch sensors a widely known in different technical fields.

From US 2003/0159910 A1 a combination of a capacitive touch sensor and an OLED device is known. The primary purpose of the device described in this document is to provide an integrated illuminated touch sensor device. In this OLED device at least one electrode of the touch responsive switching device is coupled to at least one electrode of the light emitting device.

However, it is known that touch sensor devices which are operated according to the principles described above are failure-prone, especially in harsh environmental conditions. This is due to the fact that a detection signal is generated when a predefined threshold value has been exceeded, e. g. when the induced current in a capacitive sensor exceeds a threshold value. However, the absolute value might change due to temperature and/or surface conditions of the sensor device. Thus, the touch sensor device might not be reliable enough.

SUMMARY OF THE INVENTION

It is an object of the invention to provide an illumination device that provides a reliable near field imaging function.

This object is achieved by an OLED device with a cathode, an anode and an active stack, wherein
the anode is segmented into a plurality of anode segments each defining a OLED segment, and
a capacitance measuring unit is provided which is arranged for measuring a plurality of capacitance coefficients between at least two anode segments and/or between at least one anode segment and a reference point, respectively.

Accordingly, like prior art OLED devices, the OLED device according to the invention comprises an anode, a cathode and an active stack comprising at least one active layer between anode and cathode. However, according to the invention, at least the anode is segmented into a plurality of anode segments. Thus, it is a main feature of the invention to provide an OLED with at least two OLED segments with different anode segments which provides for the possibility of measuring the capacitance between one and/or the other of these anode segments and a reference point, like surrounding earth, and/or between the anode segments themselves, respectively.

This design is based on the recognition that the failure rate of a capacitive touch sensor can be reduced when the detection is not related to an absolute value which, as described above, is typically unknown, but to a gradient change of the detected signal. Thus, absolute value changes are inherently filtered out. As a result, a robust touch sensitive illuminated device is achieved.

According to the invention, at least two capacitance coefficients are measured, e.g. between different anode segments and/or between an anode segment and surrounding earth. This capacitance measurement can be based on different techniques; especially the capacitance can be measured directly or indirectly. Further, the measurement can be done qualitatively or quantitatively. Furthermore, it can be sufficient to detect that changes of the capacitance coefficients have occurred.

According to a preferred embodiment of the invention, the capacitance measuring unit is adapted for measuring current change in a plurality of anode segments, respectively. This means that, according to this preferred embodiment of the invention, at least in two different anode segments the respective current change is determined. Then, from current change the corresponding capacitance values can be estimated.

The OLED segments can be designed in different ways. According to a preferred embodiment of the invention, the OLED segments comprise a common cathode, and a driver is provided for supplying the OLED segments with a predefined voltage in parallel connection. According to an alternative preferred embodiment of the invention, the OLED segments each comprise their "own" segment cathode, and a driver is provided for supplying the OLED segments with a predefined voltage in series connection. Thus, "isolation" of the OLED segments from each other can be achieved in different ways. Depending on the question if a common cathode is provided for the "isolated" OLED segments, different driving schemes for providing the anode segments with a predefined voltage are used.

In general, the OLED segments could be provided with different predefined voltages. However, according to a preferred embodiment of the invention, the predefined voltage is the same for all OLED segments. This way, the influence of cross coupling capacitance and internal OLED capacitance can be avoided making the device more reliable.

As a driver, in general, different types can be used. However, according to a preferred embodiment of the invention, the driver is a high frequency generator. This means that, when the OLED device is used as a proximity sensor, the high frequency generator is coupled to all OLED segments with respect to ground, driving these segments with preferably the same predefined voltage. The current flowing into each segment is a measure of the effective capacitance between each segment and ground.

As already mentioned above, preferably current sensors are used to detect the current flowing into each individual OLED segment. When a dielectric object, like a fingertip, approaches the OLED segments, in general, a significant capacitance change takes place relative to ground. This capacitance change will affect all OLED segments and, therefore, each segment current will change. Depending on the position of the dielectric object, the amount of capacitance change varies among the segments and depends on the relative position of the dielectric object to the array of segments.

Generally, the complete area of the OLED device can be segmented into OLED segments. However, according to a preferred embodiment of the invention, only part of the OLED device is segmented into OLED segments. Further, in general, the OLED segments may comprise uniform shapes.

However, according to a preferred embodiment of the invention, the OLED segments comprise shapes and relative orientations to each other which allow position sensing by an additional spatial dimension. This way, coupling coefficients become position dependent along the varying form of an OLED segment allowing to determine the position of the object along the respective segment.

Further, according to a preferred embodiment of the invention, the OLED devices described above are used for dimming and/or color control of an illumination device.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
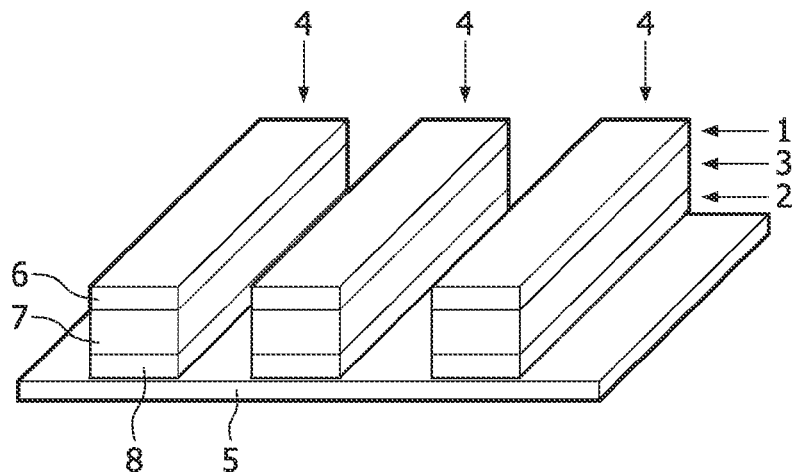
FIG. 1 shows a schematic depiction of an OLED device according to a first preferred embodiment of the invention.

From FIG. 1, an OLED device according to a first preferred embodiment of the invention can be seen. This simplified depiction shows an OLED device with a cathode 1, an anode 2 and an active stack 3. The active stack 3 comprises at least one active layer. As can be seen from FIG. 1, the cathode 1, the anode 2 and the active stack 3 are segmented into three OLED segments 4 which are provided on a common glass substrate 5. Accordingly, each OLED segment comprises a segment cathode 6, an active stack segment 7 and an anode segment 8. Since a glass substrate 5 and an anode 2 made of ITO (indium tin oxide) are used, light generated in the at least one active layer of an active stack 3 can be emitted through anode 2 and glass substrate 5.

According to the first preferred embodiment of the invention, the plurality of OLED segments 4 is used as a capacitive proximity sensor. For that, the effective capacitance value for each segment with respect to a reference point (ground) is determined and their change is detected when a dielectric object like a fingertip approaches the OLED device. In the following, it is described how the OLED device according to the first preferred embodiment of the invention is driven and how changes of capacitance coefficients are determined.

Figure 2:
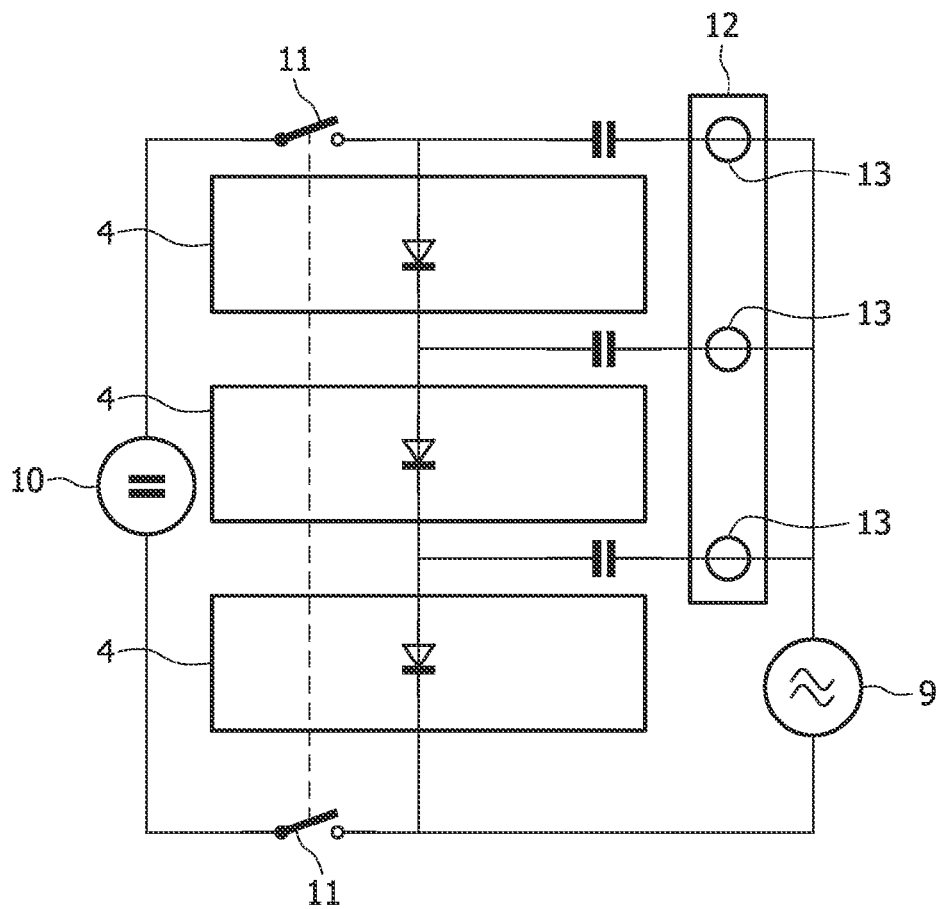
FIG. 2 shows a connection scheme for the OLED device according to the first preferred embodiment of the invention, FIGS. 3a,b show the charge distribution for the case that a dielectric object approaches the OLED device.

From FIG. 2, a connection scheme for the supply and touch sense function of the OLED device according to the first preferred embodiment of the invention can be seen. Since the three OLED segments 4 do not comprise a common cathode but each has a segment cathode 6, respectively, the OLED segments 4 are provided in series connection. As a driver 9 for the OLED segments 4 a high frequency generator is used that supplies the three OLED segments 4 with a predefined voltage which is the same for all OLED segments 4.

During normal operation, i.e. for light purposes, the OLED device according to the first preferred embodiment of the invention is connected to a DC voltage source 10. When used as a proximity sensor, the DC voltage source 10 is separated from the OLED device with the help of switches 11. Then, the high frequency generator is coupled to all OLED segments 4. A capacitance measuring unit 12 is provided which comprises current sensors 13 for detection of the current flowing into each individual OLED segment 4.

When a dielectric object approaches the OLED segments 4, a significant capacitance change takes place with respect to ground. In general, this will affect all OLED segments 4 and, therefore, each current of the OLED segments 4 will change. Depending on the position of the dielectric object, the capacitance change varies among the segments and depends on the relative position of the dielectric object to the array of segments.

Figure 3A:
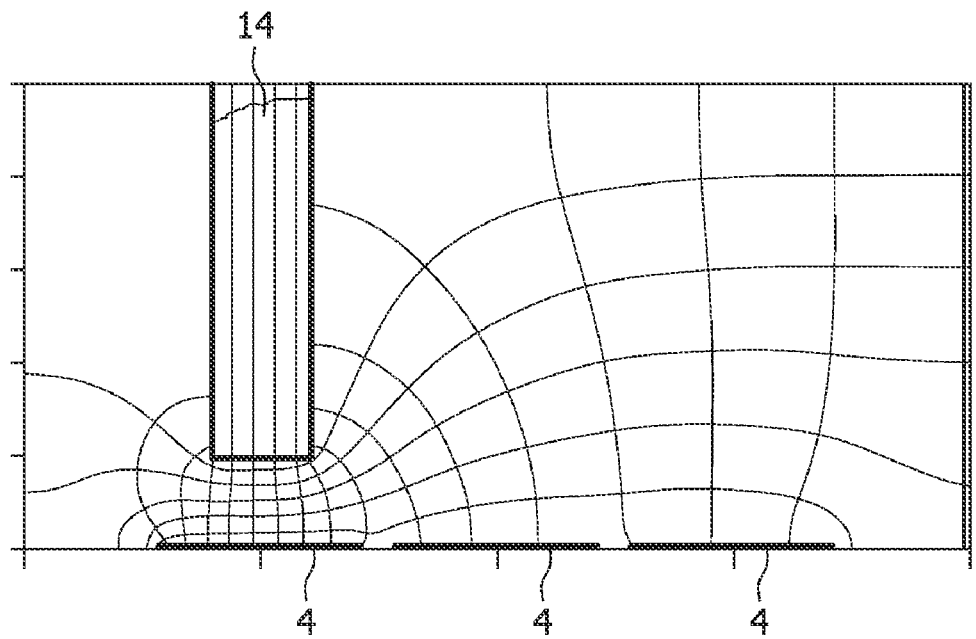
Figure 3B:
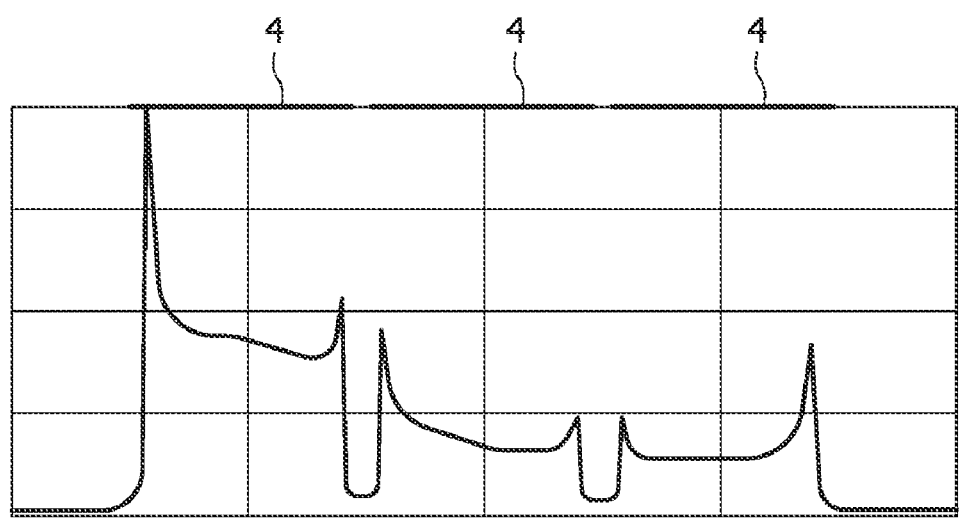

An example for that can be seen from FIGS. 3a and 3b which show the charge distribution as a measure for the effective capacitance for a case in which a dielectric object 14 has approached the OLED segment 4 on the left side. This way, a reliable proximity sensor integrated into an OLED device is achieved.

Figure 4:
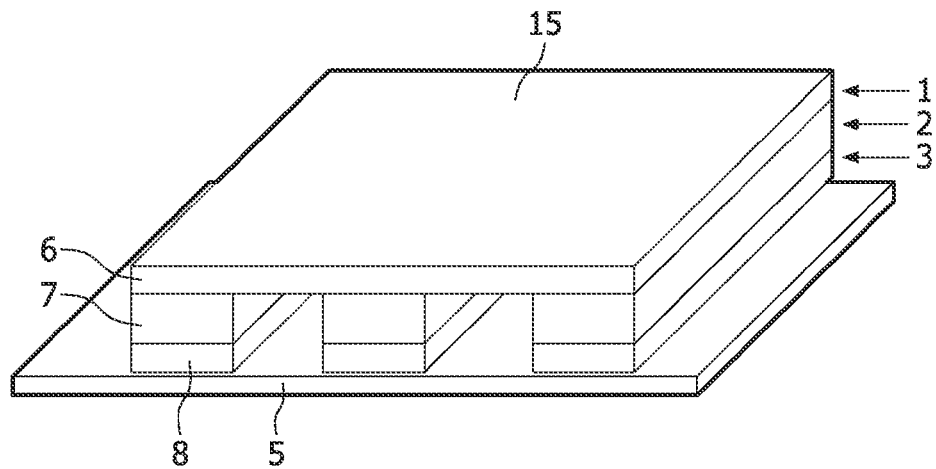
FIG. 4 shows an OLED device according to a second preferred embodiment of the invention.
Figure 5:
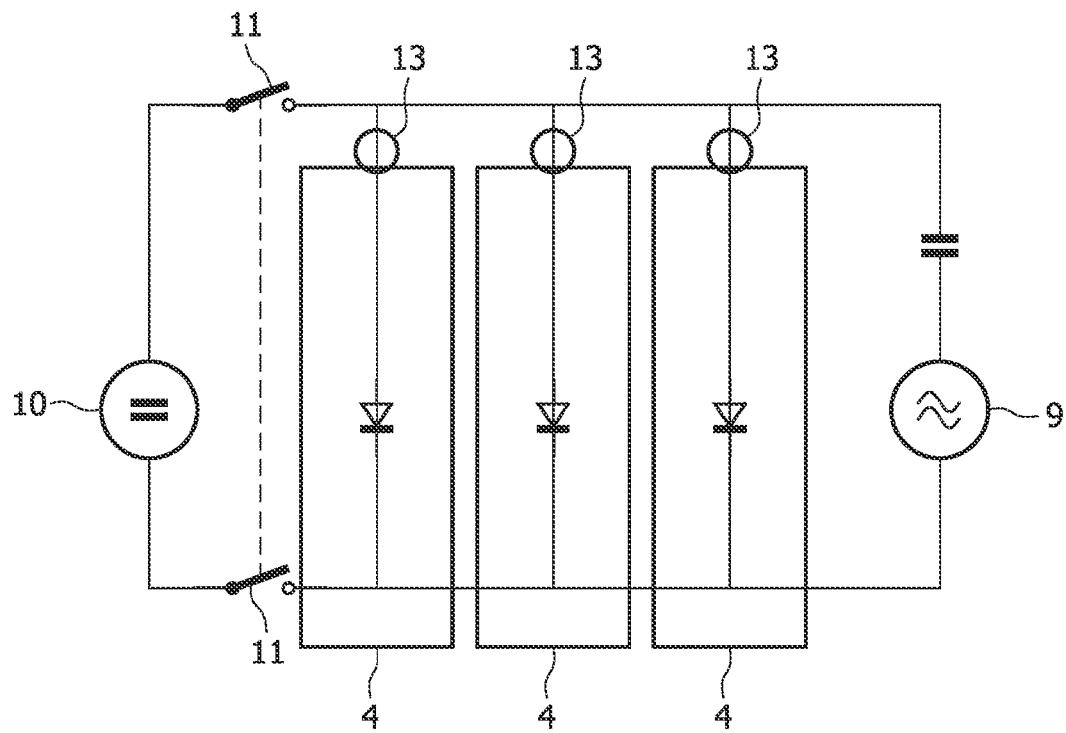
FIG. 5 shows the connection scheme for the OLED device according to the second preferred embodiment of the invention, FIG. 6 schematically shows an OLED device according to a third preferred embodiment of the invention.

As can be seen from FIGS. 4 and 5 which show a second preferred embodiment of the invention, a similar circuit arrangement can be realized for OLED segments 4 which comprise a common cathode 15 and which are, thus, connected in parallel.

Figure 6:
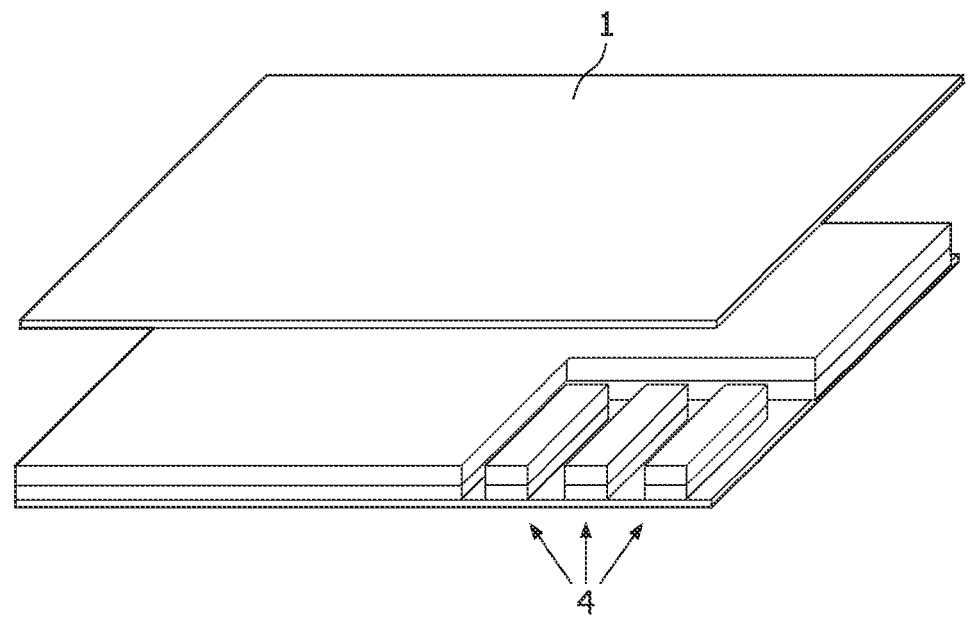

Further, from FIG. 6, an OLED device according to a third preferred embodiment of the invention can be seen. According to the third preferred embodiment of the invention, the OLED segments 4 also comprise a common cathode 1. However, the OLED segments 4 which are "isolated" from each other do not fill the complete OLED area. Instead, the OLED device according to the third preferred embodiment of the invention only comprises partial segmentation. This way, the function of capacitance proximity sensor, as described above, is only realized for a predefined area of the OLED device.

Figure 7:
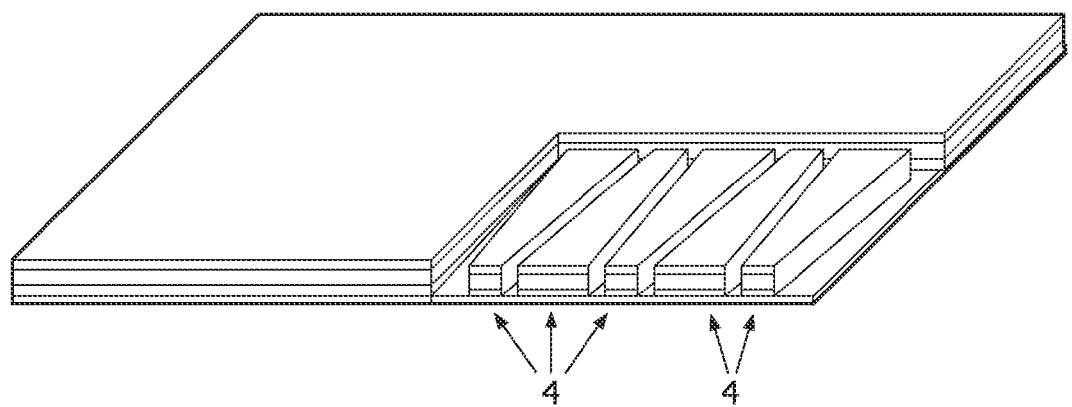
FIG. 7 shows an OLED device according to a fourth preferred embodiment of the invention.

From FIG. 7, another OLED device with partial segmentation can be seen. This OLED device according to the fourth preferred embodiment of the invention comprises non-uniform OLED segments 4. This allows position sensing by an additional spatial dimension since the coupling coefficients become position dependent along the varying cross-section of each OLED segment 4.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An OLED device comprising:
    an anode segmented into a plurality of anode segments, at least two of the anode segments defining OLED segments,
    a common cathode shared by the OLED segments, an active stack disposed between the anode and the common cathode,
a driver configured to supply a same predefined voltage to each of the OLED segments in parallel with each other, and
a capacitance measuring unit for measuring a plurality of capacitance coefficients between the at least two anode segments and/or between at least one anode segment and a reference point, respectively,
wherein the driver is a high frequency generator.

2. The OLED device of claim 1, wherein the capacitance measuring unit is adapted for measuring a current change in a plurality of the anode segments, respectively.

3. The OLED device of claim 1, wherein each of the anode segments defines an OLED segment.

4. The OLED device of claim 1, wherein the OLED segments comprise shapes and/or relative orientations with respect to each other which allow position sensing by an additional spatial dimension.

5. The OLED device of claim 1, wherein the capacitance measuring unit comprises a plurality of current sensors each configured to detect a current flowing into a corresponding one of the OLED segments.

6. The OLED device of claim 1, wherein the anode segments include two adjacent anode segments each having a shape of a non-rectangular quadrilateral, including a first side and a second side longer than the first side, wherein the two adjacent anode segments are arranged such that the first side of a first one of the anode segments is aligned with a second side of a second one of the adjacent anode segments, and the second side of the first anode segment is aligned with the first side of the second anode segment.

7. An OLED device comprising
a cathode,
an anode segmented into a plurality of anode segments, at least two of the anode segments defining OLED segments,
an active stack disposed between the anode and the cathode, and
a capacitance measuring unit for measuring a plurality of capacitance coefficients between the at least two anode segments and/or between at least one anode segment and a reference point, respectively,
wherein the capacitance measuring unit includes a driver configured to supply the OLED segments with a predefined voltage for measuring the plurality of capacitance coefficients, and
wherein the driver is a high frequency generator.

8. The OLED device of claim 7, wherein the capacitance measuring unit is adapted for measuring a current change in a plurality of anode segments, respectively.

9. OLED device according to claim 7 wherein the OLED segments each comprise a segment cathode, and the driver is configured to supply the OLED segments with the predefined voltage in a series connection with all of the OLED segments.

10. The OLED device of claim 7, wherein each of the anode segments defines an OLED segment.

11. The OLED device of claim 7, wherein the OLED segments comprise shapes and/or relative orientations with respect to each other which allow position sensing by an additional spatial dimension.

12. The OLED device of claim 7, wherein the capacitance measuring unit comprises a plurality of current sensors each configured to detect a current flowing into a corresponding one of the OLED segments.

13. The OLED device of claim 7, wherein the anode segments include two adjacent anode segments each having a shape of a non-rectangular quadrilateral, including a first side and a second side longer than the first side, wherein the two adjacent anode segments are arranged such that the first side of a first one of the anode segments is aligned with a second side of a second one of the adjacent anode segments, and the second side of the first anode segment is aligned with the first side of the second anode segment.

14. An OLED device comprising
an anode segmented into a plurality of anode segments,
a cathode segmented into a plurality of cathode segments corresponding to the plurality of anode segments,
for at least two of the anode segments and the corresponding cathode segments, an active stack disposed between the anode segments and the cathode segments, defining at least two OLED segments, and
a capacitance measuring unit for measuring a plurality of capacitance coefficients between at least two anode segments and/or between at least one anode segment and a reference point, respectively,
wherein the capacitance measuring unit comprises:
a driver, wherein the driver and the at least two OLED segments are all connected in series with each other and where the driver is configured to supply a predetermined voltage to the series connection, and
a plurality of current sensors each configured to detect a current flowing through one of the OLED segments in response to the predetermined voltage.

15. The OLED device of claim 14, wherein the driver is a high frequency generator.

16. The OLED device of claim 14, wherein each of the anode segments defines an OLED segment.

17. The OLED device of claim 14, wherein the OLED segments comprise shapes and/or relative orientations with respect to each other which allow position sensing by an additional spatial dimension.

18. The OLED device of claim 14, wherein the capacitance measuring unit comprises a plurality of current sensors each configured to detect a current flowing into a corresponding one of the OLED segments.

19. The OLED device of claim 14, wherein the anode segments include two adjacent anode segments each having a shape of a non-rectangular quadrilateral, including a first side and a second side longer than the first side, wherein the two adjacent anode segments are arranged such that the first side of a first one of the anode segments is aligned with a second side of a second one of the adjacent anode segments, and the second side of the first anode segment is aligned with the first side of the second anode segment.

* * * * *